United States Patent
Chuang et al.

[11] Patent Number: 6,008,080
[45] Date of Patent: Dec. 28, 1999

[54] METHOD OF MAKING A LOW POWER SRAM

[75] Inventors: Andy Chuang; Tzong-Shien Wu; Sun-Chieh Chien, all of Hsinchu, Taiwan

[73] Assignee: United Microelectronics Corp., Hsinchu, Taiwan

[21] Appl. No.: 08/975,488

[22] Filed: Nov. 21, 1997

[51] Int. Cl.$^6$ .................................................. H01L 21/70
[52] U.S. Cl. ......................... 438/200; 438/213; 438/231
[58] Field of Search ..................................... 438/286, 200, 438/213, 231, 210; 257/344, 356, 408, 393, 903

[56] References Cited

U.S. PATENT DOCUMENTS

| | | | |
|---|---|---|---|
| 5,472,899 | 12/1995 | Hsue et al. ................................ | 438/279 |
| 5,514,880 | 5/1996 | Nishimura et al. ......................... | 257/70 |
| 5,547,888 | 8/1996 | Yamazaki .................................. | 438/279 |
| 5,625,217 | 4/1997 | Chau et al. ................................ | 257/412 |
| 5,710,449 | 1/1998 | Lien et al. ................................. | 257/393 |
| 5,744,839 | 4/1998 | Schoenfeld ................................ | 257/356 |
| 5,780,912 | 7/1998 | Burr et al. ................................. | 257/408 |
| 5,789,787 | 8/1998 | Gardner ..................................... | 257/369 |
| 5,804,477 | 9/1998 | Lien et al. ................................. | 438/210 |

OTHER PUBLICATIONS

Sasaki et al., A 9–ns 1–Mbit Cmos SRAM, IEEE Journal of Solid State Circuits vol. 24, No. 5, pp. 1219–1225, Oct. 1989.

*Primary Examiner*—Donald L. Monin, Jr.
*Assistant Examiner*—Michael Dietrich
*Attorney, Agent, or Firm*—Rabin & Champagne, P.C.

[57] ABSTRACT

An SRAM is formed having the six transistor cell. The pull down transistors are formed so that no arsenic is implanted into the drains of the pull down transistors so that the drains of the pull down transistors are doped only by phosphorus implantation. The sources of the pull down transistors are doped with an LDD configuration of phosphorus ions and then a further implantation of arsenic ions is performed. This can conveniently be accomplished by providing an opening in the mask used to implant impurities into the source/drain regions of the ESD protection circuit.

13 Claims, 3 Drawing Sheets

METHOD OF MAKING A LOW POWER SRAM

BACKGROUND OF THE INVENTION

1. Field of the Invention

The present invention relates to the formation of static random access memories (SRAMs) in a manner that allows the memories to have low standby power usage.

2. Description of the Related Art

Reduced geometry integrated circuit designs are adopted to increase the density of devices within integrated circuits in hopes of increasing performance and decreasing the costs of the integrated circuits. Modem integrated circuit memories, including DRAMs, SRAMs, ROMs, EEPROMS, etc., are prominent examples of the application of this strategy. The density of memory cells within integrated circuit memories continues to increase, accompanied by a corresponding drop in the cost per bit of storage within such devices. Increases in density are accomplished by forming smaller structures within devices and by reducing the separation between devices or between the structures that make up the devices. Often, these smaller design rules are accompanied by layout, design and architectural modifications which are either made possible by the reduced device sizes or are necessary to maintain performance when such smaller design rules are implemented. As an example, the reduced operating voltages used in many conventional integrated circuits are made possible by improvements in design, such as reduced gate oxide thickness and improved tolerance controls in lithographic processing. On the other hand, reduced design rules make reduced operating voltages essential to limit the effects of hot carriers generated in small size devices operating at higher, previously conventional operating voltages.

Another operating parameter affected by altering the design rules used to manufacture an integrated circuit memory device is the power consumption within static random access memories (SRAMs). SRAMs are frequently used in applications which require low power consumption when the SRAM is in its standby state. For example, portable computing devices require low power consumption at all times to prolong battery life. Other computing applications require low power operation in some operating states, such as desk top computers which have a low power consumption "sleep" state that the computer enters after an extended period of inactivity. For such a computer, or at least for some components of such a computer like the modem, it is desirable to keep as much of the operating state of the computer as is practical in integrated circuit memory (as opposed to hard disk or mass storage memory) so that the computer can rapidly resume normal operation after being awoken from its sleep state. To maintain low power consumption, it is important to use SRAM for storage of the operating state of the computer, because other types of memory use too much power (DRAM) or are not suited for the purpose (EEPROMs, flash). As SRAM density increases due to the application of reduced design rules, it becomes more difficult to maintain acceptably low levels of power consumption. For the reduced design rules, the devices within the SRAM become smaller and there is a tendency for the smaller devices to exhibit an increased level of leakage, so that the leakage for each cell tends to increase. This problem is compounded for higher density SRAM designs because the number of cells in the SRAM increases for the increased design rules so that the higher cell leakage is multiplied by the larger number of cells. It is accordingly important to reduce the level of charge leakage in SRAM cells to make the higher density SRAMs more useful for low power consumption applications.

Typical SRAM designs include two or four MOS transistors coupled together in a latch configuration having two charge storage nodes for storing the charge states which correspond to the data stored in the cell. The SRAM cell includes two pull down transistors and two load devices which may be polysilicon load resistors but are more typically thin film transistors in modem SRAMs. Each of the charge storage nodes includes at a connection between a corresponding pull down transistor and a corresponding one of the load devices and each of the charge storage nodes is coupled to the gate electrode of the other pull down transistor in the conventional latch configuration. Data are read out of the conventional SRAM cell in a non-destructive manner by selectively coupling each charge storage node to a corresponding one of a pair of complementary bit lines. The selective coupling is accomplished by a pair of pass transistors, each pass transistor connected between one of the charge storage nodes and the corresponding one of the complementary bit lines. Word line signals are provided to the gates of the pass transistors to switch the pass transistors ON during data read operations. Charge flows through the ON pass transistors to or from the charge storage nodes, discharging one of the bit lines and charging the other of the bit lines. The voltage changes on the bit lines are sensed by a differential amplifier. For the SRAM cell's latch to remain stable during such a data reading operation, at least one of the charge storage nodes within the SRAM must charge or discharge at a faster rate than charge flows from or to the corresponding bit line. This control is typically maintained in part by making the channel of the pass transistor connected to the particular charge storage node narrower and/or longer than the channel of at least one of the SRAM pull-down transistors having a drain connected to the particular charge storage node. This geometry allows more current to flow through the at least one SRAM pull-down transistor than through the corresponding pass transistor; consequently, the charge storage node charges or discharges faster than the corresponding bit line discharges or charges.

During standby operation when the SRAM is not performing read or write operations, charge tends to leak from the charge storage nodes in a manner that could eventually result in loss of data from the cells of the SRAM or could render data within some of the cells to become indeterminate. To address this problem, SRAMs are designed to maintain the potential on the charge storage node by causing charge to be provided to the charge storage node, preferably at a very slow average rate that is well matched to the level of charge leakage from the charge storage node. SRAM cells provide two load devices each connected between a charge storage node and the high reference potential. Charge flows either constantly or intermittently from the high reference potential through the load devices to the respective charge storage nodes to replace the charge that leaks from the charge storage node. Because operation of the load devices, whether active or passive, uses power at all times in which data are stored on the SRAM, reduction of the power consumption by the load devices has been studied in attempts to reduce the power consumption of higher density SRAMs. For example, U.S. Pat. No. 5,514,880 to Nishimura, et al., entitled "Field Effect Thin-Film Transistor for an SRAM with Reduced Standby Current," describes a variety of different designs intended to control the leakage through thin film transistors used as the load devices of an SRAM.

With continuing needs to reduce the power consumption and increase the integration density of SRAMs, there remains a further need to reduce the power consumption of individual SRAM cells and of complete SRAM circuits.

SUMMARY OF THE PREFERRED EMBODIMENTS

According to one aspect of the present invention, a static random access memory (SRAM) is made by providing for an SRAM cell a high reference potential contact, a lower reference potential contact, and a charge storage node. A pull-down transistor connected between the charge storage node and the lower reference potential contact is provided with a source connected to the lower reference potential and a drain connected to the charge storage node, wherein the drain of the pull down transistor does not include arsenic as a dopant. A pass transistor is connected between the charge storage node and a bit line. A load device is connected between the charge storage node and the high reference potential contact.

Another aspect of the invention provides a method of making a static random access memory (SRAM) having a plurality of SRAM cells comprising pull down transistors and pass transistors. A pull-down transistor is provided with a gate electrode over a gate oxide layer, and a source and a drain region is provided by performing a first phosphorus implantation self aligned to the gate electrode, providing insulating spacers alongside the gate electrode, and performing a second phosphorus implantation self aligned to the insulating spacers, thereby providing a phosphorus LDD structure for a source and a drain of the pull down transistor. The source region is connected to a low reference potential and the drain region connected to a charge storage node. The pull down transistor is masked with an implantation mask that exposes a portion of the pull down transistor that will be part of the source region of the pull down transistor and that covers at least another portion of the pull down transistor that will be part of the drain region of the pull down transistor and implanting arsenic ions into the source region of the pull down transistor. A pass transistor is connected between the charge storage node and a bit line and a load device is connected between the charge storage node and a high reference potential contact.

Another aspect of the invention provides a method of making a static random access memory (SRAM) having a plurality of SRAM cells comprising pull down transistors and pass transistors by providing a pull-down transistor having a source and a drain, the drain of the pull down transistor provided with a dopant consisting essentially of phosphorus. The source of the pull down transistor has a higher dopant concentration than the drain of the pull down transistor. A pass transistor is connected between a charge storage node and a bit line and a load device is connected to the charge storage node and a reference potential contact.

DESCRIPTION OF THE PREFERRED EMBODIMENTS

Figure 1:
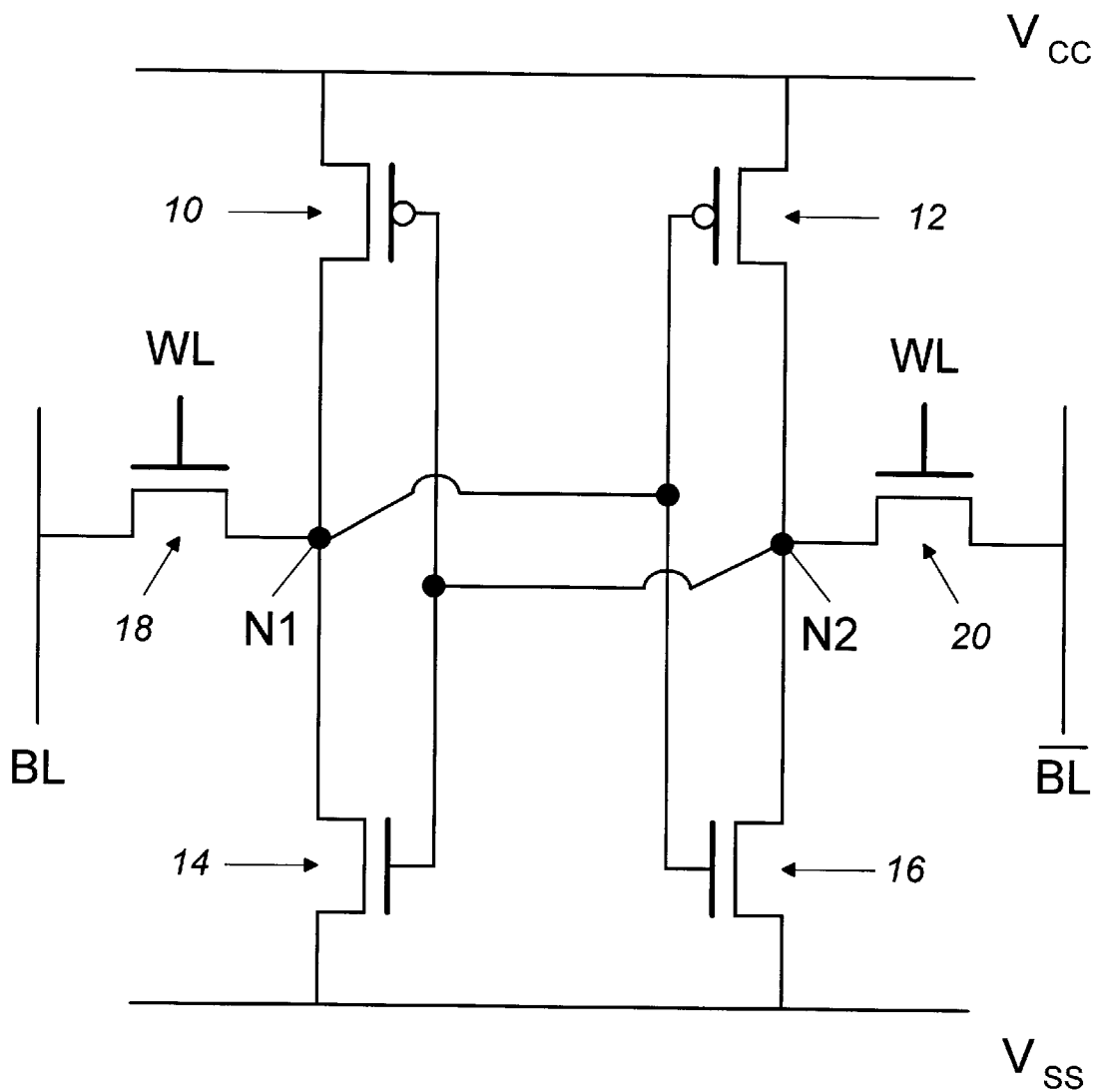
FIG. 1 is a schematic illustration of a six transistor (6T) SRAM cell in accordance with a preferred embodiment of the present invention.

Particularly preferred embodiments of the present invention provide a method of manufacturing an SRAM cell that has reduced levels of power consumption and which exhibits desirable levels of data stability and operational speed. An important aspect of preferred embodiments of forming an SRAM in accordance with the present invention is that the pull down transistors of the SRAM are formed so that the drains of the pull down transistors are formed without the implantation of arsenic or heavier N-type dopants. It is known that implantation of ions into a semiconductor substrate can impart significant damage to the crystalline lattice of the substrate. This is one of the reasons why ion implantation steps are always followed by annealing steps in conventional integrated circuit manufacturing processes. It is conventionally believed that these annealing steps repair the lattice damage of the implantation step, restoring the implanted lattice to a high quality crystalline state. The present inventors have determined that the implantation of arsenic ions into the drain regions of the pull down transistors of an SRAM damages the substrate in a manner that is not adequately removed by annealing the substrate. This may reflect the fact that the damage associated with arsenic implantation is so severe that it cannot readily be annealed out. Alternately, it may be that the strain introduced to the lattice by accommodating the larger arsenic atoms introduces a leakage component to the arsenic implanted drains of conventional pull down transistors distinct from the leakage associated with non-crystalline source or drain regions.

Regardless, because the drains of the pull down transistors are directly connected to the respective charge storage nodes of the SRAM cell, the level of charge leakage associated with the implantation of arsenic ions into the drains of the pull down transistors provides an undesirable amount of leakage to the charge storage nodes that undesirably increases the power consumption of the SRAM cell. It is believed that the undesirable charge leakage associated with the use of arsenic ion implantation to define the drains of pull down transistors of an SRAM cell will also be evident if other, larger and heavier, N-type dopants such as antimony (Sb) are implanted to define the drains of the pull down transistors of the SRAM cell. The present inventors have determined that reduced levels of leakage from the charge storage nodes are observed when the drains of the pull down transistors of the SRAM are defined solely through the implantation of phosphorus ions. This aspect of the invention is particularly enhanced in some embodiments by limiting the implantation dosage to less than about $1 \times 10^{14}/cm^2$ ions of phosphorus for the pull down transistor drains. Most preferably, the drains of the pull down transistors have the lightly doped drain (LDD) construction typically formed by defining a gate electrode, performing a first implantation aligned to the edges of the gate electrode, forming insulating sidewall spacers on the edges of the gate electrode and performing a second implantation aligned with the edges of the sidewall spacers.

The use of phosphorus doped drains for the pull down transistors of the SRAM cell reduces the typical driving capability of the pull down transistor. As such, it is important when adjusting the operating characteristics of the pull down transistor to reduce the leakage from the charge storage node that the adjustments be accommodated so that the pull down transistor has sufficient driving capability in comparison to the pass transistors to ensure the stability of the SRAM cell. Such an accommodation might be made in the characteristics of the pass transistor or in the characteristics of the pull down transistor. Particularly preferred embodiments of the invention provide a source for the pull down transistors with improved driving capability in part to accommodate the reduced driving capability associated with the particularly preferred configuration of the drains of the pull down transistors. This may be accomplished by providing a comparatively high level of arsenic doping to the source region of the pull down transistors. In particularly preferred embodiments of the present invention, the arsenic implantation is a third implantation into the source region of the pull down transistor. As such, the particularly preferred embodiments of the present embodiment provide asymmetric pull down transistors for the SRAM cell.

The source region of the pull down transistor desirably has a high driving capacity, in many aspects similar to the sort of high driving capacity of the peripheral circuitry of the SRAM, in particular the ESD protection circuitry of the SRAM. A particularly preferred embodiment of the present invention forms the sources of the pull down transistors at the same time using the same implantation step used to form at least some of the source/drain regions of the electrostatic discharge protection (ESD) circuitry of the peripheral circuitry. This will produce a source for the pull down transistor that has driving capabilities similar to the high driving capability of the source and drain regions of the ESD protection transistors of the peripheral circuitry. These and other aspects of the present invention are now described with reference to the figures.

FIG. 1 illustrates an SRAM cell (a six transistor or 6T cell) including two PMOS load transistors 10, 12 and two NMOS pull-down transistors 14, 16 connected to form cross-coupled inverters. Each of the PMOS load transistors 10, 12 has its gate connected to the gate of a corresponding NMOS pull-down transistor 14, 16. The drains of the PMOS load transistors 10, 12 have their drains connected to the drains of corresponding NMOS transistors 14, 16 to form inverters having the conventional configuration. The sources of the load transistors are connected to a high reference potential, typically $V_{CC}$, and the sources of the pull-down transistors are connected to a lower reference potential, typically $V_{SS}$, which may be ground. PMOS transistor 10 and NMOS transistor 14 make up one inverter and the gates of PMOS transistor 10 and NMOS transistor 14 are connected to the drains of transistors 12, 16 of the other inverter. Similarly, the gates of PMOS transistor 12 and NMOS transistor 16 which make up the other inverter are connected to the drains of transistors 10, 14. Hence, the potential present on the drains of transistors 10, 14 (node N1) of a first inverter is applied to the gates of transistors 12, 16 of a second inverter and the charge serves to keep the second inverter in an ON or OFF state. The logically opposite potential is present on the drains of transistors 12, 16 (node N2) of the second inverter and on the gates of transistors 10, 14 of the first inverter, keeping the first inverter in the complementary OFF or ON state. Thus, the latch of the illustrated SRAM cell has two stable states: one state with a predefined potential present on charge storage node N1 and a lower potential on charge storage node N2 and a second state with the lower potential on charge storage node N1 and the predefined potential on charge storage node N2. Binary data are recorded by toggling between the two states of the latch. Sufficient charge must be stored on the charge storage node, and thus on the coupled gates of associated inverter, to unambiguously hold one of the inverters "ON" and the other of the inverters "OFF", thereby preserving the memory state. The stability of an SRAM cell can be quantified by the margin by which the potential on the charge storage nodes can vary from its nominal value while still keeping the SRAM cell in its original state.

The state of the SRAM cell is conventionally read out by selectively connecting the two charge storage nodes N1, N2 of the cell to a pair of complementary bit lines (BL, $\overline{BL}$). A pair of pass transistors 18, 20 are connected between the charge storage nodes N1, N2 and the corresponding bit lines BL, $\overline{BL}$. Prior to a read out operation, the bit lines BL, $\overline{BL}$ are equalized at a voltage midway between the high and low reference voltages, typically ½·($V_{CC}$–$V_{SS}$), and then a signal on the word line WL turns the pass transistors ON. As an example, consider that N1 is charged to a predetermined potential of $V_{CC}$ and N2 is charged to a lower potential $V_{SS}$.

When the pass transistors 18, 20 turn ON, charge begins flowing from node N1 through pass transistor 18 to bit line BL. The charge on node N1 begins to drain off to the bit line BL and is replenished by charge flowing through load transistor 10 to node N1. At the same time, charge flows from the bit line through pass transistor 20 to node N2 and the charge flows from the node N2 through the pull-down transistor 16. To the extent that more current flows through pass transistor 18 than flows through transistor 10, charge begins to drain from the node N1 which, on diminishing to a certain level, can begin turning OFF pull-down transistor 16. To the extent that more current flows through pass transistor 20 than flows through pull-down transistor 16, charge begins to accumulate on charge storage node N2 which, on charging to a certain level, can begin turning OFF load transistor 10.

Generally, six transistor SRAM cells use thin film transistors (TFTs) as the two load devices 10 and 12. For such a two TFT SRAM cell configuration, the source, drain and channel regions as well as the gate electrodes of the load transistors 10, 12 are all formed from polysilicon deposited on a layer of insulating material that covers a lower layer of SRAM circuitry that includes the pass transistors and the pull-down transistors formed at the surface of the substrate. Particular aspects of the TFT construction and of the layout of the SRAM are not central to the present discussion and so are not described further here. Methods and structures for achieving a compact cell layout and for achieving low levels of leakage from TFT load devices are discussed in U.S. Pat. No. 5,514,880 to Nishimura, et al., entitled "Field Effect Thin-Film Transistor for an SRAM with Reduced Standby Current," which methods and structures are hereby incorporated by reference. It should be noted that the Nishimura patent uses arsenic implantation in the source and drain regions of its pull down transistor; that portion of the Nishimura patent's teachings is not incorporated as a teaching here.

Figure 2:
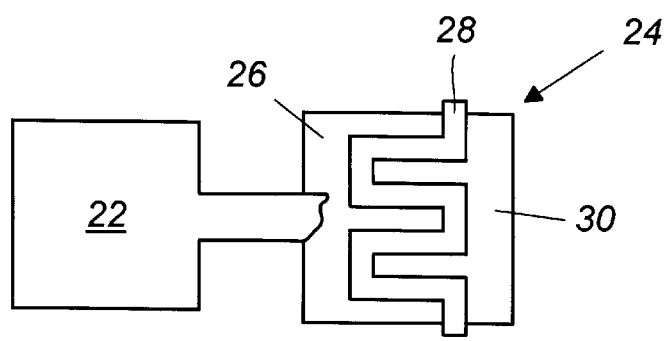
FIG. 2 is a schematic illustration of an electrostatic discharge (ESD) protection circuit that might be provided in the peripheral circuitry of an SRAM formed in accordance with preferred embodiments of the present invention.

An aspect of the invention relates to the use of a common implantation step for forming a portion of the peripheral circuitry of the SRAM at the same time that the source region of the pull down FETs are formed. FIG. 2 illustrates one component of the peripheral circuitry of an SRAM in accordance with the present invention. Reference numeral 22 identifies the typically metal bonding pad that is used for connecting each of the input and output terminals of the SRAM to other circuits. For example, the pad 22 might be used to provide to the SRAM address signals or to provide or read data from the SRAM. One or more different levels of supply and reference voltages might also be provided to the SRAM through external contact pads like that shown in FIG. 2. An extension from the pad, shown in partial cutaway view, makes contact with a source or a drain of a transistor of an ESD protection device, which is illustrative of the peripheral ESD circuits 24 of the SRAM. The illustrated ESD protection device 24 is a floating gate transistor having source/drain regions 26, 30 and a polysilicon floating gate 28. Each of the source/drain regions 26, 30 has a doping profile appropriate to a transistor for handling and driving relatively large currents. As such, these source/drain regions desirably have the sort of characteristics that are particularly preferred for the pull down transistors of an SRAM cell formed in accordance with the present invention. It should be appreciated that there are other devices in the peripheral circuitry that also preferably have a high current driving capability. For example, it is desirable for the input/output (I/O) buffers that receive signals from and supply signals to the pad 22 to also have a high driving capability. Typically, however, the driving capabilities of such I/O circuits are not as well matched to the desired pull down transistor source characteristics as the source and drain regions of the ESD protection devices. As such, it is most preferred for the source region of the pull down transistor to have current driving characteristics similar to those of the ESD protection transistors. For simplicity in the following illustrations, a single NMOS transistor of an ESD protection circuit 24, different from the one illustrated in FIG. 2 but generally serving the same purpose, is shown beginning with FIG. 3. This discussion refers to peripheral devices as those circuits which generally service the I/O functions, including ESD protection, for the SRAM. This is to be contrasted with the transistors and amplifiers to be found with the main memory cell array of the preferred SRAM device. Those transistors are referenced here as cell transistors.

Figure 3:
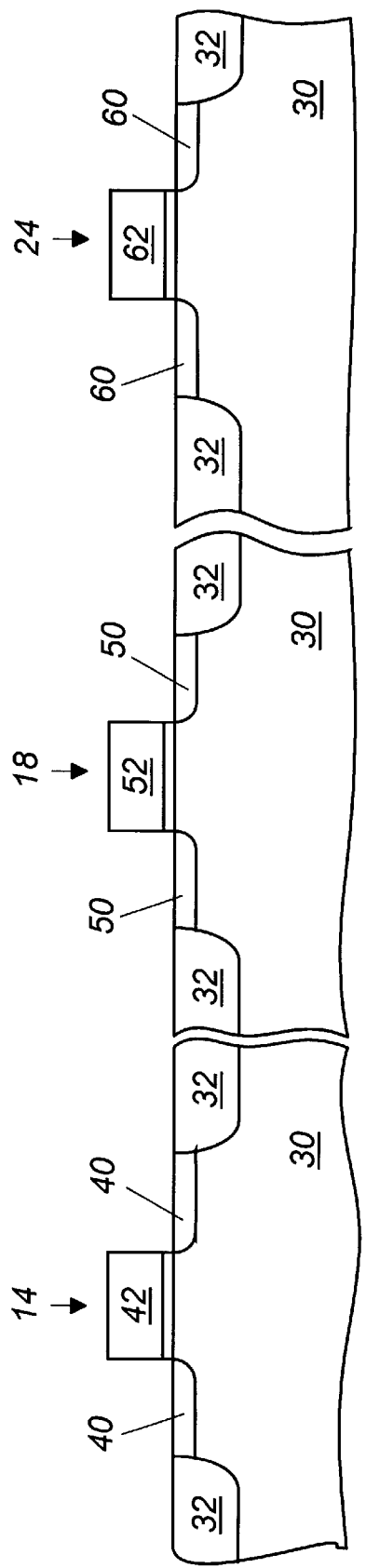
FIGS. 3–5 schematically illustrate different portions of an SRAM at different stages of manufacture in accordance with preferred embodiments of the present invention.

FIG. 3 illustrates two cell transistors 14, 18 corresponding to one of the pull down transistors and one of the pass transistors of the 6T cell shown in FIG. 1. Also shown in FIG. 3 is an exemplary NMOS transistor 24 of an ESD protection circuit within the peripheral circuitry. It will of course be appreciated that the various devices shown in FIG. 3 are not typically aligned or configured in the illustrated manner in a practical implementation of an SRAM. The configuration and alignment of FIG. 3 is instead distorted to simplify the explanation of the teachings of the present invention. FIG. 3 shows different portions of an SRAM at an early stage of the process flow after gate electrodes have been defined and a first source/drain implantation has been made. The SRAM is formed on a silicon substrate 30 and field oxide device isolation regions 32 are formed on the surface of the substrate 30. The field oxide device isolation regions 32 might be formed in a local oxidation of silicon (LOCOS) technique or might be provided as shallow trench isolation devices by etching trenches into the substrate and then depositing oxide by chemical vapor deposition to fill the trenches. Shallow trench isolation structure definition is completed in a chemical mechanical polishing process. After the field isolation devices 32 are provided on the substrate, a thermal oxide is grown over the substrate to a thickness of between about 30–200 Å. In some embodiments, it may be preferred to grow a thicker gate oxide layer over the devices in the peripheral circuitry, particularly if it is necessary to accommodate a higher operating voltage in the peripheral circuitry than is used in the memory cell array.

Polysilicon is deposited over the surface of the device, doped and then patterned to define gate electrodes 42, 52 and 62 appropriate for each of the different types of transistors within the illustrated structure. It should be appreciated that, while the figures show gate electrodes that have similar sizes and shapes, this is often not the case in practice because each of these transistors has different current driving and operational requirements and will typically have their respective characteristics adjusted to obtain the stability and performance characteristics desired for the SRAM. Still referring to FIG. 3, a light blanket doping of phosphorus ions at a low dosage and energy is next provided to the substrate using the gate electrode 42, 52, 62 as a mask for the self-aligned implantation of the lightly doped (N-) portions 40, 50, 60 of the source drain regions of the illustrated devices. This blanket implantation of the lightly doped portions of the LDD source/drain regions is, in accordance with preferred embodiments of the invention, provided to a dosage of about $1-3 \times 10^{13}/cm^2$ with an energy of about 35 KeV. The result of the process so far is schematically illustrated in FIG. 3. The pull-down transistor 14 consists of source/drain regions 40 formed at the surface of the substrate 30 and a gate electrode 42 formed above a gate oxide layer on the surface of the substrate (not shown). Pass transistor 18 includes source/drain regions 50 formed at the surface of the substrate and a gate electrode 52 formed on a gate oxide layer. ESD protection circuit transistor 24 includes source/drain regions 60 and a gate electrode 62. The gate electrodes of the pull-down, pass and ESD protection circuitry transistors are formed at least partially from doped polysilicon. When the gate electrodes are formed as multiple layers of conductive material, at least the lowest portion of the gate electrodes is formed from a layer of doped polysilicon. The lowest layers of doped polysilicon within the gates of the pull-down and pass transistor electrodes 42, 52, 62 may be formed from a single layer of polysilicon or, in other configurations of the SRAM cell, different layers of conductors, including tungsten silicide or titanium silicide may be incorporated within the gate electrodes of the pull-down, pass and ESD protection circuit transistors.

Figure 4:
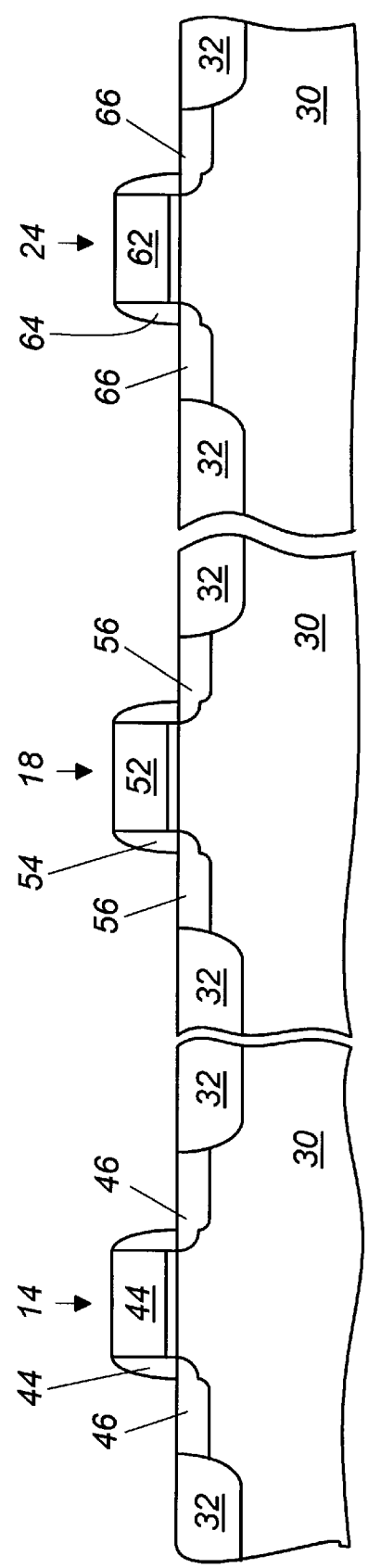

FIG. 4 shows the device after insulating spacer structures are formed on either side of the gate electrodes as part of the process of forming lightly doped drain structures for the source/drain regions of the pass, pull down and peripheral transistors. The insulting spacer structures might be formed from silicon oxide or, for smaller design rules, the spacer structures might preferably be silicon nitride. In the illustrated embodiment, the spacer structures are formed by depositing a layer of CVD oxide to a thickness of between about 1500–2500 Å and then etching back the oxide layer to expose the source/drain regions and to form oxide spacer structures 44, 54 and 64 along the sidewalls of the gate electrodes 42, 52 and 62 of the pull down, pass and peripheral transistors 14, 18 and 24, respectively. For the illustrative oxide layer, the etch back operation might be performed using a reactive ion etching and a fluorine etch chemistry. The thickness of the layer deposited will largely determine the thickness of the sidewall spacer structures formed along the gate electrodes.

After the insulating spacers 44, 54 and 64 are formed alongside the gate electrodes, a second blanket implantation of phosphorus ions is made over the device to form the more heavily doped portions of the source/drain regions. In accordance with the present invention, the second phosphorus implantation provides a dosage of between $1 \times 10^{13} - 1 \times 10^{14}/cm^2$ phosphorus ions at an energy of about 40 KeV. As a result of this implantation, more heavily doped N-type regions are formed self-aligned to the spacer structures, providing LDD structures for the source/drain regions 46, 56 and 66 of the pull down, pass and ESD protection transistors 14, 18 and 24, respectively. In addition to the devices illustrated in the figures, there are typically additional devices, including a variety of additional I/O circuits within the peripheral circuitry of the SRAM. These peripheral circuits typically include inverters or other types of buffer circuitry with relatively high current driving capabilities. Such I/O circuits might include, for example, CMOS inverters consisting of coupled PMOS and NMOS transistors or might include NMOS transistors either alone or in combination with PMOS transistors. Typically, the NMOS transistors of the I/O circuitry are exposed to the first two phosphorus implantations and are then subjected to a further implantation to complete these I/O or other peripheral circuits. A mask is provided over each of the pull down, pass and ESD protection circuits illustrated in FIG. 4 and an implantation is made into the source/drain regions of the NMOS transistors of the peripheral circuitry. This implantation might consist of arsenic ions implanted to a dosage of about $2\times10^{15}/cm^2$ with an energy of about 55 KeV. This mask is stripped and a new mask is provided that will be used to complete the definition of the ESD circuitry.

Figure 5:
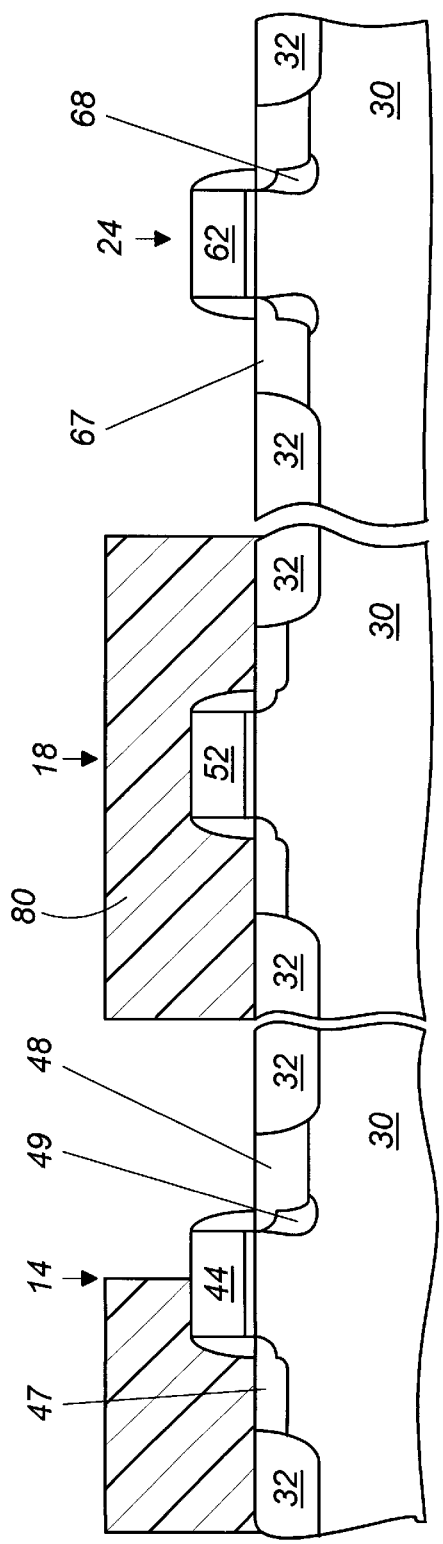

As shown in FIG. 5, an ESD mask 80 is now provided over the SRAM. As schematically illustrated in the figure, the ESD mask covers the pass transistor in its entirety and covers the drain regions of the pull down transistors so that the drains of the pull down transistors will not be subjected to the ESD implantation. The peripheral circuitry other than the ESD protection circuitry is covered by the ESD mask so that it will not be subjected to the ESD implantation. Next, an ESD implantation is made into the source/drain regions 67 of the ESD protection circuit transistors 24 and into the source 48 of the pull down transistor 14. No implant is made into the drain 47 of the pull down transistor. The first part of the ESD implantation provides a dosage of about $1\times10^{15}/cm^2$ arsenic ions with an energy of about 55 KeV. Finally, a pocket or halo implantation of boron ions is made into the ESD protection circuit transistor's source/drain regions to form a pocket doped region 68 and into the source region of the pull down transistor 14 to form a pocket doped region 49 adjacent the channel of the pull down transistor. The pocket implantation consists of boron ions implanted at tilt angle of about 30°, preferably with rotation of the substrate, at an energy of 60 KeV to provide a dosage of about $2-5\times10^{13}/cm^2$. The pocket doped regions serve to limit the punch through effect. The ESD mask 80 is then stripped. After all of the implantations have been made, the various implantations are annealed and activated either in a furnace anneal at a temperature of about 800° C. for about 20–30 minutes or in a rapid thermal annealing process at a temperature of about 1000–1100° C. for about 10–60 seconds.

Figure 6:
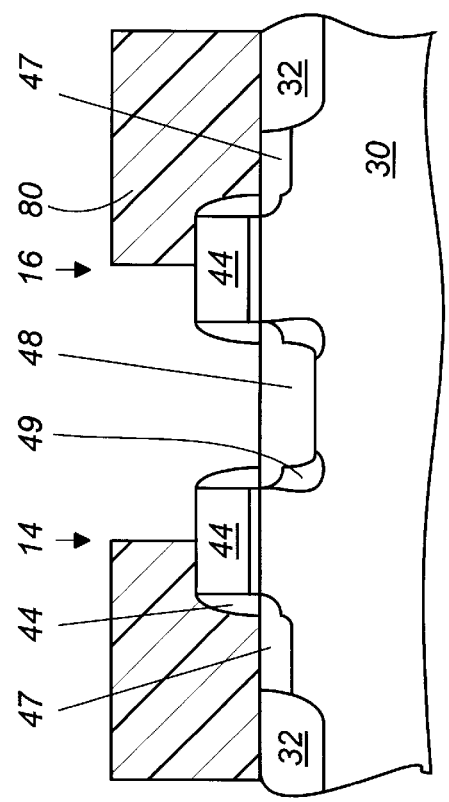
FIG. 6 provides a further illustration of an implantation performed into a common source region of two pull down transistors of an SRAM cell formed in accordance with preferred embodiments of the present invention.

FIG. 6 shows a different view of a portion of the SRAM memory cell array at the process stage illustrated in FIG. 5. In practical implementations, the pull down transistors 14, 16 of the SRAM cell are formed in a common source implementation. As such, the ESD mask 80 will be provided so as to cover the drains 47 of the pull down transistors 14, 16 and to expose the common source region to provide the relatively deep, arsenic implanted source region 48 with P-type pocket doped regions 49 on the periphery of the source region 48.

Further processing provides an insulating layer over the FIG. 5 devices and load devices on the insulating layer. The further processing steps required to complete the SRAM schematically illustrated in FIG. 1 are conventional and adequately described in the above-referenced and incorporated by reference Nishimura patent. As such, the remaining conventional processing steps are not discussed herein.

While the present invention has been described with particular emphasis on certain preferred embodiments of the present invention, the present invention is not limited to the particular embodiments described herein. Rather, the scope of the present invention is to be determined by the following claims.

What is claimed is:

1. A method of making a static random access memory (SRAM) having a plurality of SRAM cells comprising pull down transistors and pass transistors, the method of making the SRAM comprising:

providing a pull-down transistor by providing a gate electrode over a gate oxide layer, performing a first phosphorus implantation self aligned to the gate electrode, providing insulating spacers alongside the gate electrode, and performing a second phosphorus implantation self aligned to the insulating spacers, thereby providing a phosphorus LDD structure for a source and a drain of the pull down transistor, the source region connected to a low reference potential and the drain region connected to a charge storage node;

masking the pull down transistor with an implantation mask to expose a portion of the pull down transistor that will be part of the source region of the pull down transistor and covering at least another portion of the pull down transistor that will be part of the drain region of the pull down transistor and implanting arsenic ions into the source region of the pull down transistor;

providing a pass transistor connected between the charge storage node and a bit line; and providing a load device connected between the charge storage node and a high reference potential contact.

2. The method of claim 1, wherein the implantation mask has openings over peripheral circuitry of the SRAM and wherein the step of implanting arsenic ions also provides arsenic ions to a source/drain region of a peripheral transistor provided in peripheral circuitry for the SRAM.

3. The method of claim 2, wherein the peripheral transistor is a part of an ESD protection circuit for the SRAM.

4. The method of claim 3, wherein a dopant within the drain of the pull down transistor consists essentially of phosphorus provided to a dosage of less than about $1\times10^{14}/cm^2$.

5. A method of making a static random access memory (SRAM) having a plurality of SRAM cells comprising pull down transistors and pass transistors, the method of making the SRAM comprising the steps of:

providing a gate electrode over a gate oxide layer;

performing a first phosphorus implantation self aligned to the gate electrode;

providing insulating spacers alongside the gate electrode;

performing a second phosphorus implantation self aligned to the insulating spacers, thereby to complete a phosphorus LDD structure for a source and a drain;

connecting the source region to a low reference potential;

connecting the drain region to a charge storage node;

masking at least the drain region with an implantation mask while exposing the source region;

implanting arsenic ions into the exposed source region while the drain region is masked, thereby to obtain a pull down transistor having a source doped with arsenic and a drain essentially free of arsenic;

providing a pass transistor connected between the charge storage node and a bit line; and providing a load device connected between the charge storage node and a high reference potential contact.

6. A method of making a static random access memory (SRAM) having a plurality of SRAM cells and an array of bit lines for addressing the SRAM cells, the method of making the SRAM comprising:

providing for an SRAM cell a high reference potential contact, a lower reference potential contact, and a charge storage node;

providing a pull-down transistor connected between the charge storage node and the lower reference potential contact, the pull-down transistor having a source connected to the lower reference potential and a drain connected to the charge storage node, wherein the pull-down transistor is formed by:

providing a gate electrode over a gate oxide layer, performing a first phosphorus implantation self aligned to the gate electrode, providing insulating spacers alongside the gate electrode, performing a second phosphorus implantation self aligned to the insulating spacers, thereby providing a phosphorus LDD structure for the source and the drain of the pull-down transistor, masking the pull-down transistor with an implantation mask to expose a portion of the pull-down transistor that will be part of the source region of the pull-down transistor and covering at least another portion of the pull-down transistor that will be part of the drain region of the pull-down transistor, and implanting arsenic ions into the source region of the pull-down transistor, wherein the drain of the pull-down transistor does not include arsenic as a dopant;

providing a pass transistor connected between the charge storage node and a bit line; and providing a load device connected between the charge storage node and the high reference potential contact.

7. The method of claim 6, wherein the implantation mask has openings over peripheral circuitry of the SRAM and wherein the step of implanting arsenic ions also provides arsenic ions to a source/drain region of a peripheral transistor provided in peripheral circuitry for the SRAM.

8. The method of claim 7, wherein the peripheral transistor is a part of an ESD protection circuit for the SRAM.

9. A method of making a static random access memory (SRAM) having a plurality of SRAM cells comprising pull-down transistors and pass transistors, the method of making the SRAM comprising:

providing a pull-down transistor having a source and a drain, the drain of the pull-down transistor provided with a dopant consisting essentially of phosphorus, the source of the pull-down transistor having a higher dopant concentration than the drain of the pull-down transistor;

masking the pull-down transistor with an implantation mask to expose a portion of the pull-down transistor that will be part of the source region of the pull-down transistor and covering at least another portion of the pull-down transistor that will be part of the drain region of the pull-down transistor and implanting arsenic ions into the source region of the pull-down transistor;

providing a pass transistor connected between a charge storage node and a bit line; and providing a load device connected to the charge storage node and a reference potential contact.

10. The method of claim 9 wherein the implantation mask has openings over peripheral circuitry of the SRAM and wherein the step of implanting arsenic ions also provides arsenic ions to a source/drain region of a peripheral transistor provided in peripheral circuitry for the SRAM.

11. The method of claim 10 wherein the peripheral transistor is a part of an ESD protection circuit for the SRAM.

12. The method of claim 11, wherein the dopant within the drain of the pull down transistor consists essentially of phosphorus provided to a dosage of less than about $1 \times 10^{14}/cm^2$.

13. The method of claim 9, wherein the arsenic ions are provided at a dosage a factor of ten or more greater than a dosage at which phosphorus ions are provided to the drain of the pull down transistor.

* * * * *